(12) United States Patent
Heikkilä

(10) Patent No.: US 8,415,916 B2
(45) Date of Patent: Apr. 9, 2013

(54) ESTIMATION OF PARAMETERS OF AN INDUCTION MACHINE

(75) Inventor: Samuli Heikkilä, Helsinki (FI)

(73) Assignee: ABB Oy, Helsinki (FI)

( * ) Notice: Subject to any disclaimer, the term of this patent is extended or adjusted under 35 U.S.C. 154(b) by 468 days.

(21) Appl. No.: 12/829,908

(22) Filed: Jul. 2, 2010

(65) Prior Publication Data
US 2011/0001447 A1    Jan. 6, 2011

(30) Foreign Application Priority Data

Jul. 3, 2009  (EP) .................................. 09164540

(51) Int. Cl.
*H02P 1/24*   (2006.01)
(52) U.S. Cl. .................... 318/727; 318/490; 318/400.13
(58) Field of Classification Search .................. 318/727, 318/490, 400.13, 400.11, 400.02, 812, 779, 318/801
See application file for complete search history.

(56) References Cited

U.S. PATENT DOCUMENTS

| 5,388,052 A | 2/1995 | Mann |
| 2006/0273755 A1 | 12/2006 | Heikkila |
| 2010/0194319 A1 * | 8/2010 | Ito et al. .................... 318/400.13 |

FOREIGN PATENT DOCUMENTS

| DE | 44 11 149 A1 | 2/1995 |
| DE | 102 54 940 A1 | 6/2004 |
| EP | 1 729 141 A1 | 12/2006 |
| JP | 62-042076 A | 2/1987 |

OTHER PUBLICATIONS

Extended European Search Report for EP 09164540.8, completed Aug. 31, 2009.
M. Ruff et al., "Off-Line Identification of the Electrical Parameters of an Industrial Servo Drive System," Industry Applications Conference, Thirty-First IAS Annual Meeting, Conference Record of IEEE, 1996, pp. 213-220.

* cited by examiner

*Primary Examiner* — Karen Masih
(74) *Attorney, Agent, or Firm* — Buchanan Ingersoll & Rooney PC

(57) ABSTRACT

A method and an arrangement are disclosed for identifying one or more parameters of an induction machine when the induction machine is connected to the output phases of a voltage source inverter and the induction machine is in standstill state. The method can include a first phase for magnetizing the machine by providing a first DC magnetization current until the induction machine reaches steady state, the current reference of the inverter having a first value ($i_{dc\_ref1}$). A first maximum value ($i_{mz\_max}$) of the stator current ($i_{sd}$) is measured during a zero voltage vector. In a second phase, the machine is magnetized by providing a second DC magnetization current, the current reference having a second value ($i_{dc\_ref2}$) which is higher than the first reference ($i_{dc\_ref1}$). A second maximum value of ($i_{sdz\_max}$) the stator current is measured during a zero voltage vector, and a parameter of the induction machine is estimated when the measured first and second maximum values are equal.

11 Claims, 2 Drawing Sheets

ESTIMATION OF PARAMETERS OF AN INDUCTION MACHINE

RELATED APPLICATION

This application claims priority under 35 U.S.C. §119 to European Patent Application No. 09164540.8 filed in Europe on Jul. 3, 2009, the entire content of which is hereby incorporated by reference in its entirety.

FIELD

The present disclosure relates to a method and an arrangement for identifying motor parameters, such as parameters of an induction motor.

BACKGROUND INFORMATION

When a frequency converter or similar device is used for controlling the motion of a motor, it is desirable to know the motor parameters. The machine parameters can be used in control algorithms of the converter for accurate control of the load. The parameters of the machine can be identified using an identification procedure during the commissioning of the drive. In this identification run, the converter can perform one or more tests on the machine and can estimate the parameters to be used for control.

In some situations, the load connected to the machine can produce some restrictions to the drive so that identification procedure cannot be carried out. The load connected to the controlled motor can produce counter torque which disturbs the identification run to the extent that identification procedure does not provide accurate results enabling precise control of the motor. It might also happen that the identification run cannot be performed with the load at all due to maximum speed and/or maximum torque limits set for the load. In these situations, the identification run can involve the controlled machine being completely taken off from the load. This can be cumbersome and sometimes even impossible if the machine to be controlled is an integral part of the mechanics of the load.

For these purposes, frequency converters may have an option for a stand-still identification procedure in which the rotor of the machine is not rotated. However, the stand-still procedures identify only some of the parameters of the motor while other parameters are calculated using rated values of the machine.

FIG. 1 shows an L-equivalent circuit of an induction machine. The stator resistance $R_s$ of the equivalent circuit can be quite easily identified using DC-magnetization current (i.e., stator current $i_s$) produced with a constant stator voltage $u_s$. Rotor resistance $R_R$ and stray inductance $\sigma L_s$ can be identified using a DC-current with summed pulsed current or with some other injected current.

In known stand-still identification methods, the measurement of main inductance $L_M$ and the rotor time constant $\tau_r$ ($=L_M/R_R$) depending thereon can be very tricky because the machine cannot be rotated. This is due to the fact that in stand-still methods, the stator current pulses used are almost entirely summed with opposing phases to the rotor current. As such, corresponding changes in the magnetizing current $i_m$ are relatively small and thus the response from the main inductance to the test pulses is poor.

The known stand-still methods cannot reach satisfying estimates for the main inductance and rotor time constant and these parameters have been approximated from a slip frequency and a power factor calculated from the rated values of the machine or from a cos θ value given as rated value. However, the rated values are not necessarily exact so that the values obtained for main inductance and rotor time constant with the known stand-still identification methods are inaccurate which is reflected as poorer performance of the control when compared with that with parameters obtained with identification runs performed with rotating machines.

The accuracy of the voltage measurement should be increased considerably so that sufficiently accurate estimates for the main inductance $L_M$ or rotor time constant $\tau_r$ could be calculated in stand-still methods. The increase in voltage accuracy is hard to achieve because, due to reduced costs, the output voltage in frequency converters has been calculated using a measured DC bus voltage and output switch combination. In this kind of measurement, the commutation delays and threshold voltages cause inaccuracies to the voltage measurement. These inaccuracies can be quite considerable when compared with the voltage response from the main inductance in the injection frequency.

The rotor flux can be estimated during DC magnetization using a voltage model represented as:

$$\psi_R(t) = \int_{t_0}^{t} (u_{sd} - R_s i_{sd}) dt - \sigma L_s i_{sd} \qquad (1)$$

when the magnetization of the machine, which is initially free from magnetization, is started at time instant $t_0$. During the magnetization, the magnetizing current increases as the rotor current decreases when the stator current is kept constant. As seen for example from FIG. 1, the stator current equals the difference between the magnetizing current and the rotor current.

The rotor flux increases with the increasing magnetizing current according to:

$$\psi_R(t) = L_M i_m(t) \qquad (2)$$

If the DC magnetization is stopped at time instant $t_1$, the main inductance can be calculated as a quotient between the rotor flux estimate $\psi_R(t_1)$ calculated with equation (1) and the magnetizing current:

$$L_M = \frac{\psi_R(t_1)}{i_m(t_1)} \qquad (3)$$

The value of the magnetizing current $i_m(t_1)$ at time instant $t_1$ in equation (3) is uncertain. In known methods, the magnetizing current is attempted to be calculated from the current and/or voltage responses during the magnetization, when other parameters of the machine are known or when the other parameters are estimated from the mentioned responses together with the main inductance $L_M$. Due to eddy currents formed in the machine during transients and skin effect in the rotor windings, which the simple L-equivalent circuit does not take into account, the above methods are inaccurate. Further inaccuracies can be caused by saturation of inductances, which should be taken into account when estimating the value of magnetizing current from the current and/or voltage waveforms during the DC magnetization.

Modeling of the machine in the transient state could alternately use a magnetizing time that is so long that the machine is in a steady state before stopping the magnetization at time instant $t_1$. In the steady state, the value of magnetizing current corresponds to that of the stator current so that the main inductance $L_M$ could be estimated as a quotient between the rotor flux estimate and the DC current reference used in magnetization; that is:

$$L_M \approx \frac{\psi_R(t_1)}{i_{dc\_ref}} \qquad (4)$$

However, in equation (4); the magnetization time $t_1-t_0$ should be at least four times the rotor time constant so that the DC current reference would correspond closely enough to the magnetization current at time instant $t_1$. When such a long magnetizing time is used, cumulative errors of the voltage model can decrease the accuracy of the rotor flux estimate $\psi_R(t_1)$ especially in connection with larger machines, which have a large rotor time constant. With smaller machines, the steady state can be achieved faster, but because of their larger stator resistance, the inaccuracy of the voltage model is higher. In summary, methods based on voltage model (1) and steady state equation (4) do not produce accurate estimates on machine parameters.

SUMMARY

A method of identifying a parameter of an induction machine is disclosed when the induction machine is connected to output phases of a voltage source inverter and the induction machine is in standstill state. The method includes: a first phase which includes magnetizing the induction machine by providing a first DC magnetization current ($i_m$) to the induction machine via the inverter until the induction machine reaches steady state, a current reference of the inverter having a first value ($i_{dc\_ref1}$) controlling power semiconductors of the inverter to an off-state for a predetermined period of time ($\Delta t$), controlling all output phases of the inverter to a same potential for providing a zero voltage vector, and measuring a first maximum value ($i_{mz\_max}$) of a stator current ($i_{sd}$) during the zero voltage vector. In a second phase, magnetizing the induction machine by providing a second DC magnetization current to the induction machine for a magnetization time period ($t_1-t_0$) via the inverter, the current reference having a second value ($i_{dc\_ref2}$) which is higher than the first value of the current reference ($i_{dc\_ref1}$), controlling the power semiconductors of the inverter to an off-state for the predetermined period of time ($\Delta t$), controlling all the output phases of the inverter to a same potential for providing a zero voltage vector, measuring a second maximum value ($i_{sdz\_max}$) of the stator current during the zero voltage vector, estimating a parameter of the induction machine when the measured first and second maximum values of the stator current ($i_{mz\_max}$, $i_{sdz\_max}$) are equal, and repeating the second phase with different magnetization of the induction machine when the first and second measured maximum values of the stator current are not equal.

An arrangement for identifying parameters of an induction machine is also disclosed when the induction machine is connected to the output phases of a voltage source inverter and the induction machine is in standstill state. The arrangement includes means for controlling an induction machine during a first control phase by providing a first DC magnetization current ($i_m$) to magnetize the induction machine via an inverter until the induction machine reaches steady state, a current reference of the inverter having a first value ($i_{dc\_ref1}$), and for controlling power semiconductors of the inverter to an off-state for a predetermined period of time ($\Delta t$), and for controlling all output phases of the inverter to a same potential for providing a zero voltage vector, and means for measuring a first maximum value ($i_{mz\_max}$) of a stator current ($i_{sd}$) during the zero voltage vector, the means for controlling then magnetizing the machine during a second control phase by providing a second DC magnetization current to the induction machine for a magnetization time period ($t_1-t_0$) via the inverter, the current reference having a second value ($i_{dc\_ref2}$) which is higher than the first reference ($i_{dc\_ref1}$), the means for measuring also measuring a second maximum value ($i_{sdz\_max}$) of the stator current during a zero voltage vector of the second control phase; and, means for estimating a parameter of the induction machine when the measured first and second maximum values of the stator current ($i_{mz\_max}$, $i_{sdz\_max}$) are equal.

BRIEF DESCRIPTION OF THE DRAWINGS

In the following, the disclosure will be described in greater detail by reference to exemplary embodiments and the accompanying drawings, in which.

DETAILED DESCRIPTION

A method and an arrangement are disclosed for implementing the method which can provide indirect measurement of decaying counter voltage of an induction machine. With exemplary embodiments disclosed herein, the parameters involved in control of an induction machine can be identified without rotating the machine.

In exemplary embodiments of the present disclosure, a short magnetizing time $t_1-t_0$ is used and the magnitude of the magnetizing current at time instant $t_1$ is determined in a reliable way, which does not depend on the other machine parameters and non-idealities.

Exemplary embodiments of the disclosure can eliminate inaccuracies of estimated main inductance and rotor time constant, and provide a way of directly determining a main inductance on an induction machine. The rotor time constant can also be calculated with the same measurements. An exemplary embodiment of the disclosure can provide a method for determining the rotor resistance without any further measurements.

Exemplary methods of the disclosure can include two phases. In a first phase, the machine is magnetized with a DC current using a frequency converter with a voltage source inverter or with a similar converter apparatus until a steady state has been reached. In the steady state, the magnetizing current $i_m$ has settled to the value of the DC current reference $i_{dc\_ref1}$ and the rotor flux of the machine is:

$$\psi_R = L_M i_{dc\_ref1} \qquad (5)$$

Figure 1:
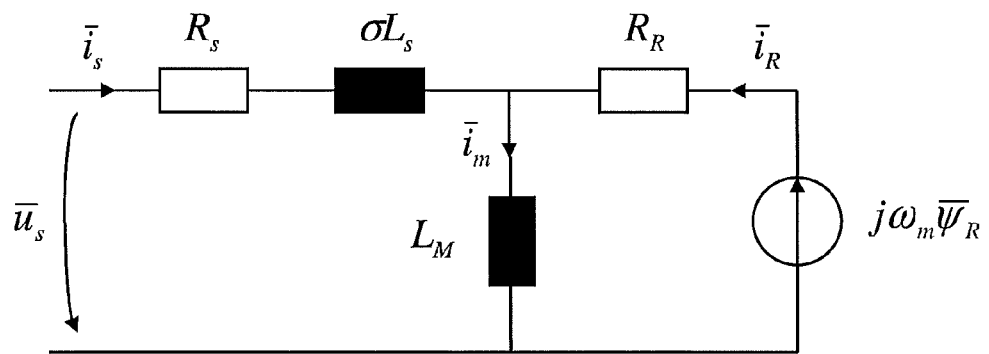
FIG. 1 shows an exemplary equivalent circuit of an induction machine.
Figure 2:
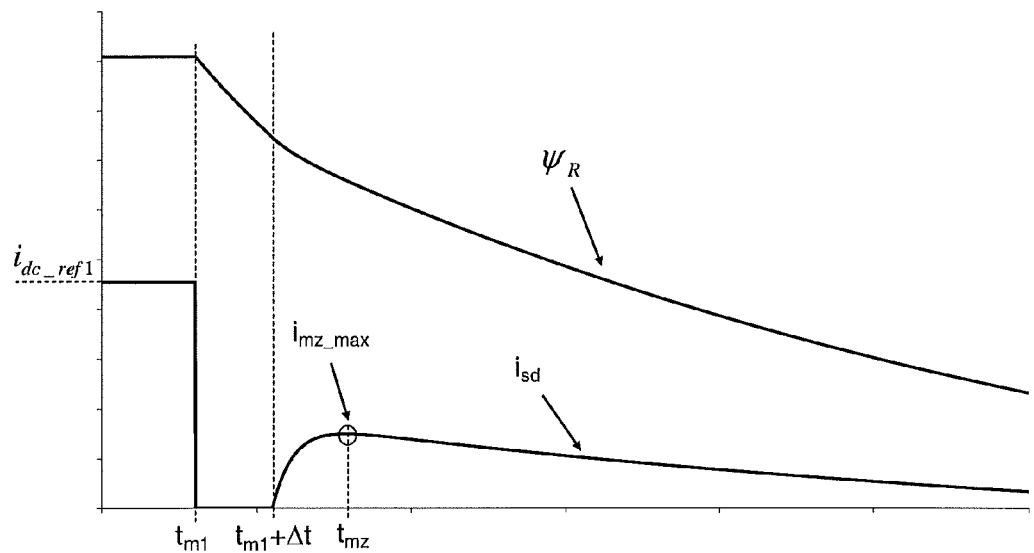
FIGS. 2, 3 and 4 show examples of flux and current waveforms in accordance with exemplary embodiments of the present disclosure.

As illustrated in FIG. 2, after the steady state has been reached, the magnetization is stopped at time instant $t_{m1}$ by passivating the power stage of the frequency converter (e.g., by controlling the output switches to OFF-state). The stator current commutates for a short period to the free-wheeling diodes, and the current vector decays rapidly to zero since there is a voltage in the terminals of the machine which has the value of the DC voltage used and opposing polarity with respect to stator current as long as the diodes carry the current. The decaying of the stator current to zero lasts, for example, approximately 200 to 300 μs (or more or less).

The decaying flux induces a voltage to the terminals of the machine. The magnitude of the voltage is:

$$u_{sd} = -\frac{\psi_R}{\tau_r}. \tag{6}$$

After a short time period $\Delta t$, the power stage of the frequency converter is activated at time instant $t_{m1}+\Delta t$ by switching all the output phases either to the positive or negative DC voltage of the intermediate voltage circuit and thereby forming a zero voltage vector. Since the threshold voltages of the switch components and diodes of the power stage can be smaller than the induced voltage (6), stator current starts to flow again when the terminal voltage of the machine equals the threshold voltage acting over the power semiconductors. As shown in FIG. 2, the stator current starts to flow in the direction of the original magnetizing current with a time constant $\sigma L_s/(R_s+R_R)$, which is considerably smaller than the rotor time constant $\tau_r=L_M/R_R$. After the current has risen a while, it reaches its maximum value $i_{mz\_max}$. After the maximum value, the current starts again to fall since the rotor flux is decaying and forcing the derivative of the stator current negative.

During the zero vector, a maximum current $i_{mz\_max}$ is reached at time instant $t_{mz}$. The maximum current $i_{mz\_max}$ is proportional to the value of the rotor flux of the machine and the magnetizing current at the time instant $t_{m1}$ when the power stage was passivated. The higher the value of the rotor flux and the magnetizing current have risen during the DC magnetization, the higher will be the local maximum of the stator current be during the zero voltage vector.

On the other hand it is known that the value of the magnetizing current at instant $t_{m1}$ equals the DC current reference used, since the machine has been in the steady state prior to the time instant. With the test of FIG. 2, the magnitude of the current maximum during the zero vector resulting from magnetizing current having a set value can be determined unambiguously, when the zero vector is activated after time $\Delta t$ from the passivating of the pulses.

This dependence between the magnetizing current and the current maximum $i_{mz\_max}$ can be used in the second phase of the method of the disclosure. In the second phase, the rotor flux of the previous magnetizing test is permitted to decay to zero. After the rotor flux has decayed to zero, the magnetization is started again with a higher DC current than in the first test. The purpose of this magnetization is to elevate the flux of the machine to the same value (e.g., approximately the same value) as was present at the end of the previous magnetization test at time instant $t_{m1}$.

Figure 3:
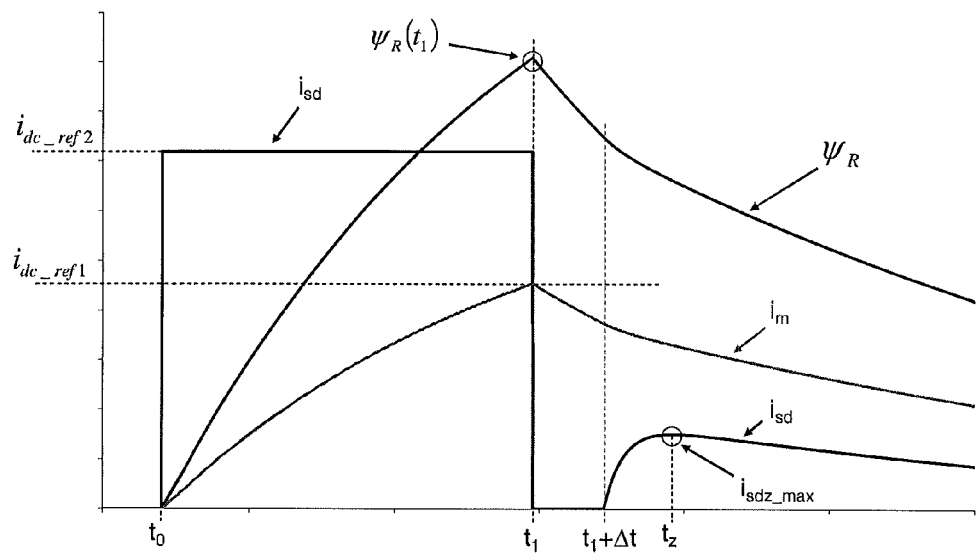

As shown in FIG. 3, the DC magnetization is started at time instant $t_0$. In an exemplary embodiment, the intention is to choose such a reference value for DC current $i_{dc\_ref2}$ that, when used, the magnetization current reaches, after a predetermined magnetizing time, the same value as at the end of the previous test. In other words, at time instant $t_1$ the magnetizing current $i_m$ should equal $i_{dc\_ref1}$.

During the DC magnetization, the magnetizing current grows according to exponential law depending on the rotor time constant:

$$i_m(t)=(1-e^{-(t-t_0)/\tau_r})i_{dc\_ref2} \tag{7}$$

The value of the DC current reference can thus be chosen as:

$$i_{dc\_ref2} = \frac{i_{dc\_ref1}}{1-e^{-(t_1-t_0)/\tau_r}}, \tag{8}$$

so that the magnetizing current would reach value $i_{dc\_ref1}$ at time instant $t_1$.

The magnetizing time is selected to be as short as possible, since the rotor flux is estimated during the magnetization with the voltage model (1). With a shorter magnetizing time, better estimation accuracy is reached since the cumulative errors resulting from the voltage integral can be kept at minimum. On the other hand, when a shorter magnetizing time is used, a higher DC current is involved so that the magnetizing current would reach the desired level at the end of the magnetizing time. The maximum current of the frequency converter thus sets the limit for the minimum magnetizing time. In practice, the magnetizing time can be selected to be approximately a time period corresponding to the rotor time constant. The DC current reference is then:

$$i_{dc\_ref2} = \frac{i_{dc\_ref1}}{1-e^{-1}} \approx 1.58 \times i_{dc\_ref1} \tag{9}$$

However, there is no need to know the exact value of the rotor time constant. In fact, the value of the rotor time constant is not necessarily needed at all, since according to the disclosure, such a current reference $i_{dc\_ref2}$ is searched iteratively, which produces a magnetizing current having a value equaling $i_{dc\_ref1}$ when the magnetization time ends.

The magnetizing current is not directly estimated, but the magnetizing test of FIG. 3 is repeated multiple times with a varying value of DC magnetizing reference $i_{dc\_ref2}$. After each magnetizing test at time instant $t_1$ the power stage of the frequency converter is passivated and the current collapses quickly to zero. When the pulses are passivated, the rotor flux decays according to the rotor time constant. At time instant $t_1+\Delta t$, zero vector is activated similarly as in the end of the first magnetizing test.

By comparing the maximum value of current determined during the zero vector $i_{sdz\_max}$ with the corresponding maximum value $i_{mz\_max}$ obtained in the first magnetizing test, it can be determined whether the magnetizing current at instant $t_1$ of passivating the pulses was lower than, higher than or equal to that in the first magnetizing test.

The current maximums $i_{sdz\_max}$ and $i_{mz\_max}$ are fully comparable since the passivation time $\Delta t$ preceding the zero vector is kept constant in all magnetization tests. If $i_{sdz\_max} < i_{mz\_max}$, it is determined that the magnetization current at time instant $t_1$ has been too low (i.e., the current reference $i_{dc\_ref2}$ should be increased). If, on the other hand, $i_{sdz\_max} > i_{mz\_max}$, it is determined that the magnetization current at time instant $t_1$ has been too high, and the current reference $i_{dc\_ref2}$ should be lowered. If $i_{sdz\_max} = i_{mz\_max}$, the magnetizing current at time instant $t_1$ must have had the same magnitude as in the first magnetizing test (i.e., the magnitude of current reference $i_{dc\_ref1}$).

Figure 4:
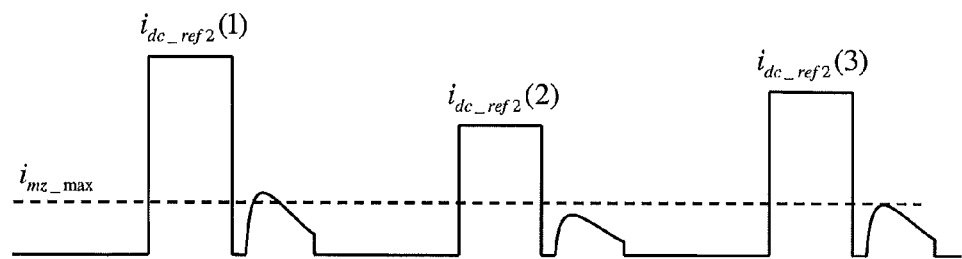

According to exemplary embodiments of the disclosure, the magnetization test of FIG. 3 is repeated by altering the current reference $i_{dc\_ref2}$, until the maximum value of current $i_{sdz\_max}$ equals $i_{mz\_max}$. There should be a pause between the consecutive tests so that the rotor flux from the previous test has been decayed to zero when the pulses are passivated. FIG. 4 shows an examplary waveform of d-component of current when a suitable current reference $i_{dc\_ref2}$ is searched.

FIG. 4 shows 3 different exemplary magnetizing tests. In each of the tests, a different DC current reference is used. In the example of FIG. 4, the optimal current reference has been found in the third test in which the maximum current during the zero vector has the same magnitude as the current maximum $i_{mz\_max}$ measured in the first magnetizing test.

In each of the magnetizing tests in FIG. 4, the rotor flux can be estimated during the DC magnetization using the voltage model (1). A voltage integral is initially set to zero at time instant $t_0$ and integration is carried out until time instant $t_1$ where the magnetization is ended. Thus, the result of an estimation of rotor flux is the value of integration at time instant $t_1$. When the current reference $i_{dc\_ref2}$ producing current maximum having value of $i_{mz\_max}$ has been found, both the rotor flux and magnetizing current at the end of the DC magnetization are known. The former can be calculated using voltage model (1), whereas the latter does not have to be calculated separately since its value is determined to be the equal to the current reference $i_{dc\_ref1}$ used in the first magnetization test as $i_{sdz\_max}$ equaled $i_{mz\_max}$.

The main inductance of the induction machine can now be calculated as a quotient between estimated rotor flux $\psi_R(t_1)$ and DC current reference used in the first magnetization $i_{dc\_ref1}$ according to equation (3):

$$L_M = \frac{\psi_R(t_1)}{i_{dc\_ref1}}. \tag{10}$$

If the current controller of the frequency converter produces errors to the actual current, a measured current during the magnetization can be used in the equation instead of the reference value $i_{dc\_ref1}$.

In some cases, the remanence flux of the machine may make the rotor flux estimate in equation (10) less accurate. However, the effect of remanence flux can be compensated by turning the direction of magnetization (and of d-axis) prior to each magnetization in the test sequence in which the current reference $i_{dc\_ref2}$ is searched as in the FIG. 4.

The estimate provided by equation (10) is not completely independent of the other parameters of the machine. According to exemplary embodiments, when the rotor flux is estimated using voltage model (1), the magnitudes of stator resistance and stray inductance have to be known. The stray inductance does not have to be known if instead of the rotor flux the stator flux of the machine is estimated:

$$\psi_s(t) = \int_{t_0}^{t} (u_{sd} - R_s i_{sd}) dt \tag{11}$$

The stator flux is equal to the rotor flux when, after the passivating of the pulses, the stator current, and also the stray flux, have decayed to zero. Thus, the stator and rotor fluxes have equal magnitude and the rotor flux can be estimated by stopping the integration of stator flux (11) after the current has dropped to zero. The decaying of the rotor flux during the falling edge of the current can be considered to be insignificant.

In the above magnetization tests, the passive time of the pulses $\Delta t$ can be selected quite freely. The shorter the passive time is, the higher values the maximum currents $i_{sdz\_max}$ and $i_{mz\_max}$ reach. This can have a positive effect on the signal to noise ratio and estimation accuracy. The passive time $\Delta t$ can be so short that the current does not fall to zero. It is to be noted that a local current maximum may not be reached if the passive time is very short. Further, with the short values of $\Delta t$, the effect of iron losses to the current maximum during the zero vector can be considerable and also different in current maximums $i_{sdz\_max}$ and $i_{mz\_max}$. This is due to different derivatives of currents during the falling edge prior to the maximum current points. For this reason $\Delta t$ should be long enough so that the effect of iron losses is decayed. In practice, a suitable value for $\Delta t$ is approximately from 4 to 10 ms (or more or less).

According to an exemplary embodiment of the disclosure, the current reference $i_{dc\_ref2}$ is kept constant in the second phase of the method. Instead of the current reference, the magnetization time $t_1-t_0$ is varied. The purpose of the variation of the magnetization time is to find a magnetization time which makes the current maximum $i_{sdz\_max}$ to be equal to current maximum $i_{mz\_max}$ of the first magnetization test. If $i_{sdz\_max} < i_{mz\_max}$, the magnetization time should be made longer, and vice versa. When the optimum magnetization time has been found, making $i_{sdz\_max}$ to equal $i_{mz\_max}$ the estimate for the main inductance $L_M$ can be calculated with equation (10).

When the above procedure has been carried out so that the main inductance can be estimated, the same values can also be used in estimating the rotor time constant. The rotor time constant can be calculated based on the current references $i_{dc\_ref1}$ and $i_{dc\_ref2}$ on the magnetizing time $t_1-t_0$ used.

According to an exemplary embodiment of the disclosure, the rotor time constant $\tau_r$ is calculated according to equation (8) giving:

$$\tau_r = \frac{t_1 - t_0}{\ln\left(\frac{i_{dc\_ref2}}{i_{dc\_ref2} - i_{dc\_ref1}}\right)}. \tag{12}$$

Further from the estimates of main inductance (10) and rotor time constant (12), rotor resistance can be calculated as:

$$R_R = \frac{L_M}{\tau_r}. \tag{13}$$

An exemplary method of the disclosure can be performed using a frequency converter having, for example, a processing unit (e.g., a computer processor) executing suitable software recorded on a computer-readable storage medium (e.g., a ROM, a hard disk drive, or other non-volatile storage media) for carrying out any of the method steps by controlling the output switches of the frequency converter (i.e., an inverter part of the frequency converter). The inverter can thus be controlled at the beginning of the method to magnetize the machine with a predetermined DC current. When the machine is considered to be in the steady state (i.e., the magnetizing current corresponds to the current reference), the modulation of the inverter is stopped. According to an exemplary embodiment, the above-described frequency converter is an example of means for implementing steps of the exemplary methods described herein.

When a predetermined time has elapsed, the output switches of the inverter can be controlled to form a zero vector (i.e., the output phases of the inverter can be controlled either to positive or to negative voltage of the intermediate voltage circuit). During the zero vector, the stator current starts to flow and the maximum value of the current is measured and stored in a memory, which is writable and readable by the frequency converter. After the rotor flux and stator current have decayed to zero, the second phase of the method is started.

In the second phase of the method, the inverter can be controlled similarly as in the first phase. In this case, a reference value for the current is given to the frequency converter or inverter, which has a higher value than in the previous magnetization. Current according to this second reference is fed to the machine, and the rotor flux of the machine starts to rise. After the magnetization has been on for a while, the inverter is again passivated, for example by taking control pulses away from the modulator that controls the switches. The inverter can be passivated for a period which has the same length as in the first test.

After the mentioned time has elapsed, a zero vector is taken into use, and again the maximum value of the stator current during the zero vector is measured. The maximum values of the stator current in the second and first magnetization are then compared in the frequency converter, and if the maximum values are equal, then the desired parameter or parameters are estimated. If the currents are not equal, then the inverter repeats the second phase with a different magnetization of the machine. The second phase can be repeated until the maximum values of the currents are equal.

Frequency converters can include a vast amount of calculation capacity (e.g., a controller and/or computer) and suitable memory for carrying out exemplary methods of the disclosure. When the parameter or parameters are estimated, each estimated value can be stored directly in the memory of the frequency converter so that the estimations can be used by a controller to control the machine.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of identifying a parameter of an induction machine when the induction machine is connected to output phases of a voltage source inverter and the induction machine is in standstill state, the method comprising:
   a first phase which includes:
   magnetizing the induction machine by providing a first DC magnetization current ($i_m$) to the induction machine via the inverter until the induction machine reaches steady state, a current reference of the inverter having a first value ($i_{dc\_ref1}$),
   controlling power semiconductors of the inverter to an off-state for a predetermined period of time ($\Delta t$),
   controlling all output phases of the inverter to a same potential for providing a zero voltage vector, and
   measuring a first maximum value ($i_{mz\_max}$) of a stator current ($i_{sd}$) during the zero voltage vector; and
   in a second phase:
   magnetizing the induction machine by providing a second DC magnetization current to the induction machine for a magnetization time period ($t_1-t_0$) via the inverter, the current reference having a second value ($i_{dc\_ref2}$) which is higher than the first value of the current reference ($i_{dc\_ref1}$),
   controlling the power semiconductors of the inverter to an off-state for the predetermined period of time ($\Delta t$),
   controlling all the output phases of the inverter to a same potential for providing a zero voltage vector,
   measuring a second maximum value ($i_{sdz\_max}$) of the stator current during the zero voltage vector,
   estimating a parameter of the induction machine when the measured first and second maximum values of the stator current ($i_{mz\_max}$, $i_{sdz\_max}$) are equal, and
   repeating the second phase with different magnetization of the induction machine when the first and second measured maximum values of the stator current are not equal.

2. A method according to claim 1, wherein the identified parameter is a main inductance of the induction machine, and wherein the second phase comprises:
   estimating rotor flux ($\psi_R(t_1)$) of the induction machine produced during the magnetization time period, and
   estimating the main inductance of the machine from an estimated rotor flux of the machine and from the first DC magnetization current.

3. A method according to claim 2, wherein the estimating of the main inductance comprises:
   using the first value of the current reference of the inverter ($i_{dc\_ref1}$) as the first DC magnetization current.

4. A method according to claim 2, comprising:
   estimating the main inductance as a quotient between estimated rotor flux ($\psi_R(t_1)$) and the first value of the current reference used in the first magnetization ($i_{dc\_ref1}$).

5. A method according to claim 2, wherein the estimating of the rotor flux comprises:
   estimating stator flux of the induction machine produced during the magnetization time period until the stator current has dropped to zero; and
   using the estimated stator flux as the rotor flux.

6. A method according to claim 1, wherein the identified parameter is the rotor time constant ($\tau_r$) of the induction machine, and wherein the method comprises:
   calculating the rotor time constant from the magnetization time period ($t_1-t_0$) and from the first and second values of the current references used in the first phase ($i_{dc\_ref1}$) and in the second phase ($i_{dc\_ref2}$).

7. A method according to claim 6, comprising:
   calculating the rotor time constant as:

$$\tau_r = \frac{t_1 - t_0}{\ln\left(\frac{i_{dc\_ref2}}{i_{dc\_ref2} - i_{dc\_ref1}}\right)}.$$

8. A method according to claim 1, comprising:
   when the measured first and second maximum values of the stator current are not equal, changing the magnetization of induction machine by changing the second value ($i_{dc\_ref2}$) of the current reference.

9. A method according to claim 1, comprising:
   when the measured first and second maximum values of the stator current are not equal, changing the magnetization of the induction machine by changing the magnetization time period ($t_1-t_0$).

10. An arrangement for identifying parameters of an induction machine when the induction machine is connected to the output phases of a voltage source inverter and the induction machine is in standstill state, wherein the arrangement comprises:
    means for controlling an induction machine during a first control phase by providing a first DC magnetization current ($i_m$) to magnetize the induction machine via an inverter until the induction machine reaches steady state, a current reference of the inverter having a first value ($i_{dc\_ref1}$), and for controlling power semiconductors of the inverter to an off-state for a predetermined period of time ($\Delta t$), and for controlling all output phases of the inverter to a same potential for providing a zero voltage vector; and means for measuring a first maximum value ($i_{mz\_max}$) of stator current ($i_{sd}$) during the zero voltage vector, the means for controlling then magnetizing the machine during a second control phase by providing a second DC magnetization current to the induction machine for a magnetization time period ($t_1-t_0$) via the inverter, the current reference having a second value ($i_{dc\_ref2}$) which is higher than the first reference ($i_{dc\_ref1}$), the means for measuring also measuring a second maximum value ($i_{sdz\_max}$) of the stator current during a zero voltage vector of the second control phase; and, means for estimating a parameter of the induction machine when the measured first and second maximum values of the stator current ($i_{mz\_max}$, $i_{sdz\_max}$).

11. An arrangement of claim 10, in combination with an induction machine.

* * * * *